United States Patent
Van Den Hurk et al.

(10) Patent No.: US 9,865,343 B2
(45) Date of Patent: Jan. 9, 2018

(54) METHOD FOR READING OUT A RESISTIVE MEMORY CELL AND A MEMORY CELL FOR CARRYING OUT THE METHOD

(71) Applicants: FORSCHUNGSZENTRUM JÜLICH GMBH, Jülich (DE); RHEINISCH-WESTFÄLISCHE TECHNISCHE HOCHSCHULE, Aachen (DE)

(72) Inventors: Jan Van Den Hurk, Aachen (DE); Elke Linn, Wuerselen (DE); Rainer Waser, Aachen (DE); Ilia Valov, Aachen (DE)

(73) Assignees: Forschungszentrum Juelich GmbH, Juelich (DE); Rheinisch-Westfaelische Technische Hochschule, Aachen (DE)

( * ) Notice: Subject to any disclaimer, the term of this patent is extended or adjusted under 35 U.S.C. 154(b) by 0 days.

(21) Appl. No.: 15/039,217

(22) PCT Filed: Oct. 29, 2014

(86) PCT No.: PCT/DE2014/000551
§ 371 (c)(1),
(2) Date: May 25, 2016

(87) PCT Pub. No.: WO2015/085977
PCT Pub. Date: Jun. 18, 2015

(65) Prior Publication Data
US 2017/0162260 A1 Jun. 8, 2017

(30) Foreign Application Priority Data
Dec. 11, 2013 (DE) .......................... 10 2013 020 517

(51) Int. Cl.
*G11C 13/00* (2006.01)
*H01L 45/00* (2006.01)

(52) U.S. Cl.
CPC ........ *G11C 13/004* (2013.01); *G11C 13/0011* (2013.01); *G11C 13/0069* (2013.01);
(Continued)

(58) Field of Classification Search
CPC .................................................. G11C 13/004
(Continued)

(56) References Cited

U.S. PATENT DOCUMENTS 9,305,636 B2 * 4/2016 Eleftheriou ......... G11C 11/5614
9,336,870 B1 * 5/2016 Mickel ................ G11C 13/0011
(Continued)

FOREIGN PATENT DOCUMENTS

DE   10 2007 015 281   10/2008
DE   10 2009 023 153   12/2010
(Continued)

OTHER PUBLICATIONS

Ilia Valov et al: "Cation-based resistance change memory", Journal of Physics D: Applied Physics, Institute of Physics Publishing Ltd, GB, vol. 46, No. 7, Jan. 31, 2013 (Jan. 31, 2013), p. 74005, XP020237322 issn: 0022-3727; DOI: 10.1088/0022-3727/46/7/074005.
(Continued)

*Primary Examiner* — Son Mai
(74) *Attorney, Agent, or Firm* — Norris McLaughlin & Marcus P.A.

(57) ABSTRACT

A method for reading out a resistive memory cell comprising two electrodes that are spaced from each other by an ion-conducting resistive material was developed, the memory cells being transferrable from a stable state having a higher resistance value (high resistive state, HRS) to a stable state having a lower resistance value (low resistive state, LRS) when a write voltage is applied. A read voltage is applied as a read pulse for reading out, wherein the (Continued)

number of ions driven through the ion-conducting resistive material during the pulse is set by way of the level and duration of the pulse in such a way, proceeding from the HRS state, they suffice for forming an electrically conducting path through the ion-conducting resistive material at least until the onset of a flow of current through this path, and thus for the transition into a metastable VRS state (volatile resistance state) having a reduced resistance value and a predefined relaxation time for return into the HRS state, but not for transition into the LRS state. In this way, it is ensured that, in all cases, the memory cell once is again in the same state after the read-out as it was prior to the read-out. This allows in particular memory elements that are composed of an antiserial circuit composed of two memory cells to be read out non-destructively, without this diminishing the option of implementing large arrays composed of these memory elements.

22 Claims, 2 Drawing Sheets

(52) U.S. Cl.
CPC .......... *H01L 45/08* (2013.01); *H01L 45/1266* (2013.01); *H01L 45/142* (2013.01); *H01L 45/143* (2013.01); *H01L 45/144* (2013.01); *H01L 45/148* (2013.01); *G11C 2013/0047* (2013.01); *G11C 2013/0052* (2013.01); *G11C 2213/33* (2013.01); *G11C 2213/52* (2013.01)

(58) Field of Classification Search
USPC .......................................................... 365/148
See application file for complete search history.

(56) References Cited

U.S. PATENT DOCUMENTS

| | | | |
|---|---|---|---|
| 9,484,090 B2* | 11/2016 | Yoshimoto | G11C 13/0023 |
| 2006/0092691 A1* | 5/2006 | Shiimoto | G11C 13/0007 |
| | | | 365/158 |
| 2012/0087173 A1* | 4/2012 | Linn | G11C 13/00 |
| | | | 365/148 |
| 2013/0242642 A1* | 9/2013 | Katayama | G11C 13/0069 |
| | | | 365/148 |
| 2013/0250655 A1 | 9/2013 | Sugimae | |
| 2016/0012884 A1* | 1/2016 | Toda | G11C 11/5614 |
| | | | 365/148 |

FOREIGN PATENT DOCUMENTS

| | | |
|---|---|---|
| DE | 10 2011 012 738 | 2/2012 |
| WO | WO-2011/037703 A2 | 3/2011 |
| WO | WO-2011/037703 A3 | 3/2011 |

OTHER PUBLICATIONS

Kawahara, A. et al: Filament Scaling Forming Technique and Level-Verify-Write Scheme With Endurance Over 107 Cycles in Re-RAM Int. Solid-State Circuits Conference Digest of Technical Papers p. 220 Feb. 17 21, 2013.

* cited by examiner

METHOD FOR READING OUT A RESISTIVE MEMORY CELL AND A MEMORY CELL FOR CARRYING OUT THE METHOD

The invention relates to a method for reading out a resistive memory cell and to a resistive memory cell for carrying out the method.

BACKGROUND OF THE INVENTION

Resistive memory elements in an antiserial circuit, composed of two resistive memory cells, according to German patent 10 2009 023 153 combine the fast access time of DRAMs with the non-volatility of flash memories and are therefore suitable for combining random access memories and bulk memories in computer technology. Digital information is encoded in these in two stable states, these being 0 and 1, in each of which the memory element has a high overall resistance. In large arrays composed of many memory elements, this minimizes parasitic currents that are superimposed on the signal that is created during read-out of individual memory elements.

So as to be able to distinguish the two states having a large signal deviation from each other during read-out, the memory element is activated using a read voltage so that this is transferred to a ON state having low overall resistance, proceeding from the state 1, but not proceeding from the state 0. The disadvantage is that this readout is destructive, which is to say the originally present 1 is lost and must be re-written to the memory element. This consumes time and energy and further shortens the service life of the memory element, since the active material degrades by a small amount with every write process, and memories are generally read much more frequently than written.

From German patent 10 2011 012 738 it is known to design resistive memory elements such that they nave differing capacitances in the states 0 and 1, and to detect this difference in a non-destructive manner during read-out. The drawback is that this advantage is achieved at the expense of the usable signal deviation decreasing very rapidly in an array that is composed of many memory elements as the array size increases.

It is the object of the invention to provide a method for reading out a memory cell, which can be used to solve the tradeoff between non-destructive read-out and a large signal deviation in an array that is composed of many memory elements.

SUMMARY OF THE INVENTION

Within the scope of the invention, a method for reading out a resistive memory cell comprising two electrodes that are spaced from each other by an ion-conducting resistive material was developed, the memory cell being transferrable from a stable state having a higher resistance value (high resistive state, HRS) to a stable state having a lower resistance value (low resistive state, LRS) when a write voltage is applied. The method requires a memory cell in which the write voltage drives a migration of ions through the ion-conducting resistive material, and an electrically conducting path through the ion-conducting resistive material is formed along the path. For reading out, a read voltage having the same polarity as the write voltage is applied, and the current flowing through the memory cell is evaluated as a measure of the resistance value of the memory cell.

The ion-conducting resistive material can be exclusively ion-conductive, for example, and can be electronically insulating. However, it may also be an electronic semiconductor, for example. The resistance values of HRS and LRS, and in particular the usable deviation between these resistance values, depend on the electronic conductivity. The material can, in particular, be a solid electrolyte. The ionic conductivity is required for migration of the ions forming the electrically conducting path.

The ions can be ions of the material of an electrode for example. This is then referred to as an electrochemical metallization memory (ECM) cell. The ions can, however, also be oxygen ions of the ion-conducting resistive material, which are driven through the ion-conducting resistive material. This is then referred to as a valence clangemechanism memory (VCM) cell.

According to the invention, the read voltage is applied as a read pulse, wherein the number of ions driven through the ion-conducting resistive material during the pulse is set by way of the level and duration of the pulse in such a way that, proceeding from the HRS state, they suffice for forming an electrically conducting path through the ion-conducting resistive material, at least until the onset of a flow of current through this path, and thus for the transition into a metastable VRS state (volatile resistance state) having, a reduced resistance value and a predefined relaxation time for return into the HRS state, but not for transition into the LRS state.

It was found that, during the transition from the HRS state to the LRS state, the formation of the electrically conducting path is a gradual process, the speed and process of which are determined by the supply of ions driven through the ion-conducting resistive material. In this way, the creation and the stability of the electrically conducting path can be precisely metered via the number of ions that are driven through the ion-conducting resistive material. Proceeding from the state having the higher resistance value, the path, proceeding from one electrode, continually progresses in the direction of the other electrode as the number of transported ions increases, until a tunneling contact is created as the first contact that allows a current to flow through the path. The flow of current through this tunneling contact depends exponentially on the width of the tunnel barrier. If this width changes even by only one atomic diameter, the tunneling current changes by three orders of magnitude. The stability of the tunneling current thus decisively depends on the number of atoms by which the tunneling current is carried. If an atom is present in the contact via which essentially the entire tunneling current flows, this current practically collapses when this one atom is diffused away or removed from the tunneling contact by another thermally or chemically induced process. As a result, if the number of ions driven through the ion-conducting resistive material is just such that a tunneling contact has barely been created, this contact is highly unstable. If additional ions are then driven, the initially still fragile tunneling contact is expanded. The tunneling current is distributed among a larger number of atoms by the path, and more particularly the tip of the path, becoming wider and thicker. At the same time, the tunnel barrier made of the ion-conducting resistive material becomes smaller as a result of the path progressing further in the direction of the other electrode. In extreme cases, a path that is completely conducting is created through the ion-conducting resistive material, so that the tunnel barrier vanishes entirely. Every additional ion that is driven through the ion-conducting resistive material increases the service life of the path at the operating temperature, until a stable state having a lower resistance value is ultimately reached. The service life of the path at the operating temperature is equivalent to the relaxation time for the destruction of the same or to the activation energy needed to destroy the same.

A tunneling contact, in particular, is so unstable that it can be destroyed again with low activation energy, and thus with a short relaxation time as well. As a result, the read-out can be carried out more quickly. In a particularly advantageous embodiment of the invention, the read pulse is thus terminated, while the electrically conducting path includes a tunnel barrier.

If the memory cell is already in the LRS state before the read pulse starts, the resistance value of the same does not change. If, in contrast, it is in the HRS state before the read pulse starts, an electrically conducting path that is only metastable is formed through the ion-conducting resistive material, and after the expiration of a relaxation time, which can be set by way of the level and duration of the pulse, which is to say by way of the number of driven ions, the path disintegrates on its own, starting at the end of the read pulse. The read pulse thus causes a brief transition into a metastable third state having a reduced resistance value (volatile resistance state, VRS), but after expiration of the predefined relaxation time will be back in the original HRS state having a high resistance value.

The VRS can thus be utilized to read out the memory cell so that, during the read-out, it nonetheless has a resistance value that is reduced compared to the HRS state, and yet the original state (LRS or HRS) of the same is maintained after the read-out has been concluded. The read-out according to the invention is thus non-destructive. This functionality is also referred to as "selector."

Only the number of ions driven by the pulse through the ion-conducting resistive material is decisive for the distinction as to whether a pulse is a read pulse, which switches the memory cell from HRS to VRS, or whether it is a write pulse, which switches the cell permanently from HRS to LRS. A pulse can thus be turned from a write pulse into a read pulse by reducing the level thereof in relation to a write pulse, by shortening the duration thereof in relation to a write pulse, or by using a combination of the two actions. It is advantageous to shorten the duration of the read pulse since the read-out then takes place more quickly, and moreover no additional voltage level is required for the read pulse in the activation circuit.

The resistance value in the metastable VRS state can be the same resistance value as is produced in the stable LRS state. In an advantageous embodiment of the invention, neither state can be distinguished from the other non-destructively, for example by measuring the resistance value using a further pulse after the relaxation time has expired, the level and duration of the pulse being selected such that it is not sufficient for either a transition from HRS to VRS or a transition from LRS to HRS. If the memory cell was in the HRS state prior to the first pulse, the first pulse caused the cell to assume the VRS state, which vanished again after expiration of the relaxation time. The second pulse thus again detects a high resistance value. If, in contrast, the memory cell was in the LRS state prior to the first pulse, this state is permanent and consequently is still present after expiration of the relaxation time. The second pulse thus detects a low resistance value.

In a particularly advantageous embodiment of the invention, a VRS state having a resistance value that ranges between the resistance values of the HRS and LRS states is selected. Current measurement during a single read pulse is then sufficient to clearly determine whether the memory cell was in the HRS state or in the LRS state prior to the start of the pulse. The resistance value of the VRS state is determined by the interaction between the specific configuration (materials and geometry) of the memory cell and the duration and level of the read pulse.

The relaxation time of the VRS state should be at least long enough that the switch into these states still functions reliably, even after many transitions from HRS to VRS, and back, or after many write processes between HRS and LRS, which each cause a small degradation of the ion conducting resistive material. On the other hand, the time determines the working speed during read-out of the memory cell. Relaxation times in the range between 10 ns and 10 µs have proven to be an advantageous compromise. It has also proven to be advantageous if the intended storage duration for the memory cell is at least 1000 times that of the relaxation time.

In a particularly advantageous embodiment of the invention, a memory cell is selected which can be transferred from the stable state LRS to the stable state HRS by a second write voltage having reverse polarity. The memory cell can in particular be a bipolar switching memory cell, which, in absolute terms, requires a lower write voltage than a unipolar memory cell. A volatile state VRS is produced only in moving from HRS to LRS, but generally not moving in reverse from LRS to HRS. This would require the electrically conducting path to be broken up just wide enough to restore itself after expiration of a relaxation time. Thermally activated processes, however, generally drive the system into a state of greater entropy and work to destroy the order that exists in the presence of the electrically conducting path. The formation of a usable volatile intermediate state in moving from HRS to LRS is therefore preferred over the formation of such a state in moving from LRS to HRS.

In a particularly advantageous embodiment of the invention, a memory cell that is in antiserial series connection with a further memory cell is selected. At the same time, the read pulse is applied via the series connection. In particular, a memory element that is designed as a resistive double cell according to German patent 10 2009 023 153 may be selected. Such a memory element has two states 0 and 1, which can be distinguished from each other and are encoded in the state combinations HRS/LRS and LRS/HRS, respectively. In both states, the memory element has a high resistance value, so that, in an array that is composed of many memory elements, each parasitic current path is interrupted in at least one location by non-addressed memory elements. In this way, individual memory elements can still be read out with a sufficiently strong signal, even in large arrays.

It was found that such a memory element can be read out non-destructively by the method according to the invention. Due to the antiserial interconnection, the write voltages of the two memory cells of the memory element have different signs. This means that a write voltage that is applied via the series connection is always able to influence only one of the two memory cells. Without limiting the general nature, the read pulse is applied with a polarity that is able to transfer the first memory cell from the stable state HRS into the metastable state VRS.

If the memory element is in the HRS/LRS state prior to the read pulse, the first memory cell is transferred into the VRS state by the read pulse, while the second memory cell remains in the LRS state. The state combination VRS/LRS having a reduced resistance value is thus present during the read pulse, so that an easily detectable read current flows. After expiration of the relaxation time, the first memory cell returns into the HRS state again, whereby the original state combination HRS/LRS is restored, If the memory element is in the LRS/HRS state prior to the read pulse, none of the two memory cells is switched since this would require a polarity in each case that is opposite that of the read pulse. The memory element thus remains in a state having a high resistance value, and the read pulse drives only a very low current through the memory element.

According to the prior art in German patent 10 2011 012 738, a memory element that, as a result of an appropriate design, has differing capacitances in the two states HRS/LRS and LRS/HRS can be read out non-destructively by way of a capacitance measurement. The achievable difference in capacitance is presently only in the order of magnitude of a factor of 10, since it is only achievable by way of a partial departure from the actually desired absolutely symmetrical composition of the memory element. The signal deviation between the two states HRS/LRS and LRS/HRS, which is therefore already comparatively low, is decreased even further in arrays that are composed of many memory elements since all memory elements that are connected in parallel to the presently addressed memory element on the same bit line form a high parasitic capacitance. At present, array sizes of 40×40 memory elements are realistic.

The read-out method according to the invention, in contrast, utilizes a considerably larger jump in the resistance value, which every memory cell of the memory element undergoes when it transitions between the HRS and LRS states. This jump can be in the order of magnitude of a factor of $10^6$ to $10^8$. When a single memory element is addressed and temporarily transferred into a state having a reduced resistance value, the read current caused thereby is significantly greater than the parasitic current through the non-addressed memory elements connected in parallel on the same bit line. Thus, the effect of the read-out method according to the invention is that non-destructive read out of the memory element can be achieved without a drastic reduction in the usable array size.

Advantageously, a relaxation time of 10 s or less is selected. This represents the range in which it is still practical to control the cell returning into the HRS state or remaining in the LRS state.

In a particularly advantageous embodiment of the invention, a relaxation time between $10^{-10}$ s and $10^{-5}$ s, and preferably between $10^{-9}$ s and $10^{-5}$ s, is selected. These times cover the range of the access times to DRAMs and bulk memories (flash memories or hard drives). The goal of developing resistive memories is a universal memory that combines the previously separate DRAM and bulk memory. Relaxation times in the claimed range are produced, for example, at resistance values of the LRS state between 10 k$\Omega$ and 15 k$\Omega$, preferably between 12.5 k$\Omega$ and 13.5 k$\Omega$, in particular at resistance values around 12.9 k$\Omega$, at which the VRS state is carried by one atom or few atoms in a tunneling contact. In principle, a high resistance value of the VRS state is attended by a short relaxation time, while conversely a low resistance value is attended by a long relaxation time. The exact correlation is material- and condition-specific.

The existing opinion in the expert community was that it was a disadvantage that, due to insufficient intensity, a write pulse might transfer a memory cell proceeding from the HRS state into a metastable VRS state instead of into the stable LRS state. Depending on the relaxation time, the user could be subject to the misconception that the information was stored safely, while in fact it vanished after a short time. In the interest of reliability of the storage process, the aspiration so far has been to suppress the occurrence of metastable VRS states in memory cells. Attempts were at least made to bring the resistance value of such a VRS state as close as possible to that of the HRS state, so that it was still detected as HRS during the digital readout of the memory cell. During subsequent data processing by the memory cell, proceeding from the VRS state in this way, at least the correct information to the effect that the memory cell had not been switched into the stable LRS state was further processed, and only the information to the effect that there had been a brief departure from the stable HRS state was lost. This resulted in fewer errors than if the VRS state had erroneously been detected as an LRS state.

So as to carry out the method according to the invention, precisely those memory cells, which according to the existing evaluation criteria were considered inferior due to a lack of stability, are thus utilized. The invention therefore also relates to a memory cell for carrying out the method according to the invention. The memory cell comprises two electrodes and a resistive memory material that is connected between the electrodes, the material having a stable state LRS having a lower electrical resistance and a stable state HRS having a higher electrical resistance.

According to the invention, the memory material can be transferred into a third metastable state VRS having a resistance value no more than one tenth the resistance value of the HRS state, wherein proceeding from this VRS state the memory material transitions into the HRS state after expiration of a predefined relaxation time. For the transfer into the metastable state, the memory material itself can be modified, for example, such as by driving oxygen ions of the memory material through the memory material for the purpose of forming an electrically conducting path. However, for example for the purpose of forming such an electrically conducting path, it is also possible to drive ions of the material of one of the electrodes through the memory material.

It was found that the undesirable VRS state according to the existing state of the art can be turned into a state that can be reliably technologically distinguished from the HRS state by way of the claimed distance between its resistance value and that of the HRS state. Thus, in conjunction with the method according to the invention, this is no longer an undesirable effect, but rather enhances the memory cell by the option of non-destructive read-out. In particular, an antiserial circuit composed of two such memory cells so as to form a memory element can thereby be rendered non-destructively readable, without this diminishing the option of implementing large arrays composed of these memory elements.

Advantageously, the memory material is an ion-conducting resistive material through which an electrically conducting path runs between the two electrodes in the LRS state. Such a path generally forms gradually, so that, proceeding from the HRS state, it is possible to control whether the VRS state or the LRS state is reached, in particular by way of the level and duration of an electric pulse that is applied to the memory cell.

The resistance value of the VRS state can correspond to that of the LRS state. Distinction from the LRS state is nonetheless possible by waiting for the relaxation time to pass. If the state returns to the HRS state again after expiration of the relaxation time, then the VRS was involved: if the state continues to exist even after the relaxation time has expired, this involves the stable state LRS. In general, however, the resistance value of the VRS state will be higher than the resistance value of the LRS state due to the instability of the VRS state.

Advantageously, the resistance value of the VRS state is at least twice as high, preferably at least five times as high, and most particularly preferably at least ten times as high as the resistance value of the LRS state. It is then technologically possible to reliably distinguish these two states prior to the expiration of the relaxation time.

In a particularly advantageous embodiment of the invention, the resistance value of the VRS state is between 10 kΩ and 15 kΩ, and preferably between 12.5 kΩ, and 13.5 kΩ. A VRS state, which returns to the HRS state following relaxation times in the order of magnitude of present DRAM access times, can be implemented particularly easily when an ion-conducting resistive material is used as the memory material, through which an unstable electrically conducting path runs between the two electrodes. Such a path is particularly unstable when the contact between the path and at least one of the electrodes consists of only one tunneling path, or few parallel tunneling paths, or even of only one contact-forming atom. According to quantum physics, an atom has the quantum conductance $e^2/h$ and the resistance value 12.9 kΩ. At a resistance value in the claimed range, it must therefore be assumed that it is not the stable LRS state that is present, but the VRS state, which is unstable due to physical and/or chemical forces acting in a dissipating manner on the path.

The resistance value of the LRS state is advantageously 5 kΩ or less, preferably 2 kΩ or less, and most particularly preferably 1 kΩ or less. This can thus, firstly, be distinguished particularly well from the VRS state, and secondly even a low read voltage results in an easily detectable read current.

In a particularly advantageous embodiment of the invention, the memory material is an ion-conducting resistive material, which is electrochemically metallized by at least one electrode material during the switch from the HRS state into the LRS state. In such systems, the physical and chemical forces acting in a dissipating manner on the electrically conducting path are particularly high, whereby short relaxation times can be implemented. In particular, high electromotive forces (EMF) form a strongly driving force for dissipation processes in these memory materials.

For example, the memory material can include a semiconductor, and at least one of the electrodes can include a precious metal. As a result of the semiconductor reacting with the precious metal so as to form an electrically conducting path through the memory element, the memory element then transitions into the LRS (or VRS) state. The semiconductor can be germanium or silicon, for example, and the precious metal can be silver, for example. In a particularly advantageous embodiment of the invention, the memory material comprises a compound of the semiconductor with sulfur, selenium or tellurium. In particular, the compound can be germanium sulfide ($GeS_x$) or germanium selenide ($GeSe_x$). By way of the stoichiometry of this compound, it is then possible to set how strongly the semiconductor is bound in the compound and what amount of substance of the semiconductor is available for forming the electrically conducting path. The greater the supply of semiconductor, the faster the stability of the electrically conducting path grows.

A similar effect can be achieved when using a memory material that comprises a compound of at least one metal that is also present in at least one electrode. The metal can in particular be copper or silver here, and the compound can in particular comprise sulfur, selenium or tellurium as a further element. For example, the compound can be $Ag_xS$, $Cu_xS$, $Ag_xSe$, $Cu_xSe$ or $Cu_xTe$.

The entire disclosure provided for the method expressly also applies to the memory element, and vice versa.

The subject matter of the invention will be described hereafter based on the figures, without thereby limiting the subject matter of the invention.

DESCRIPTION OF THE PREFERRED EMBODIMENTS

Figure 1A:
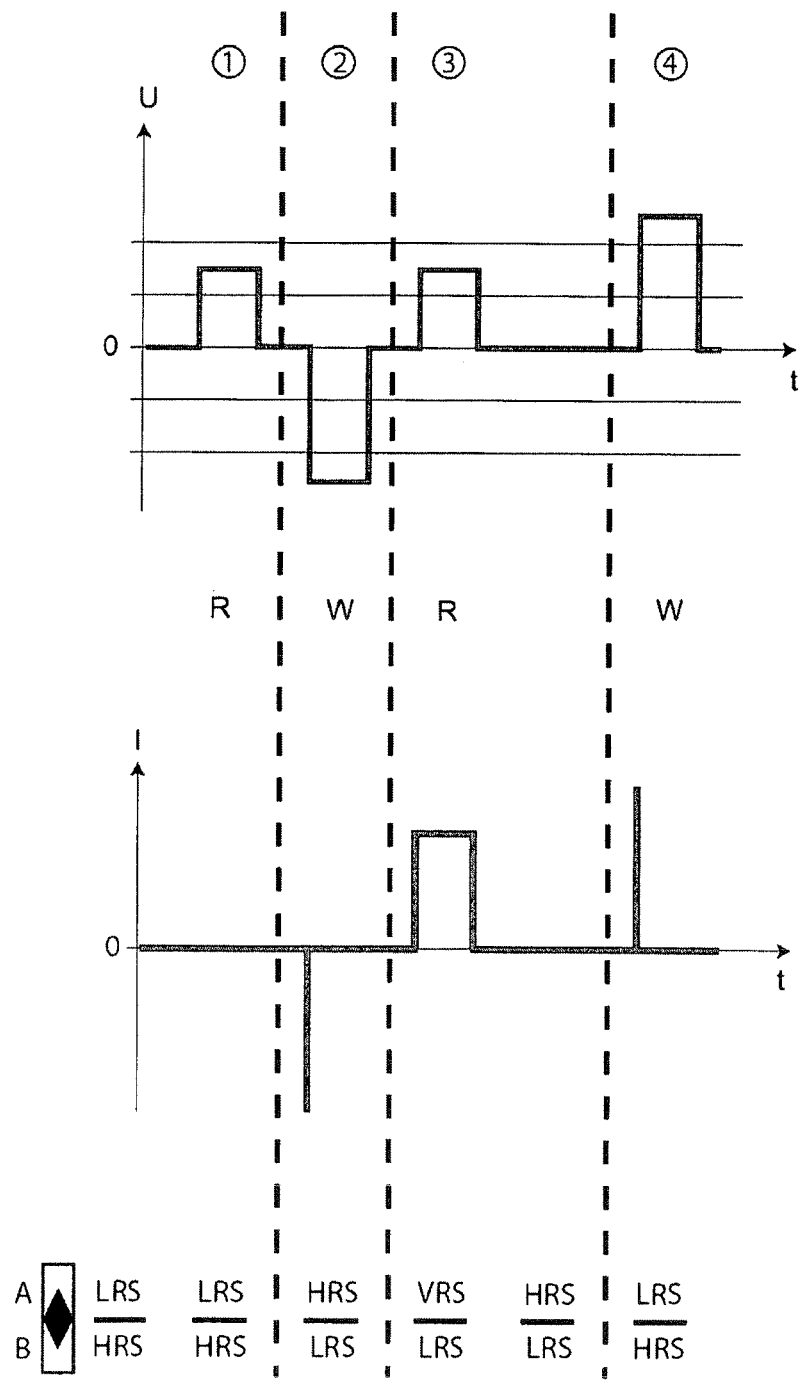
FIG 1a shows the time profile of the voltage and current during read-out according to two exempla embodiments (panels a and b) of the method according to the invention.
Figure 1B:
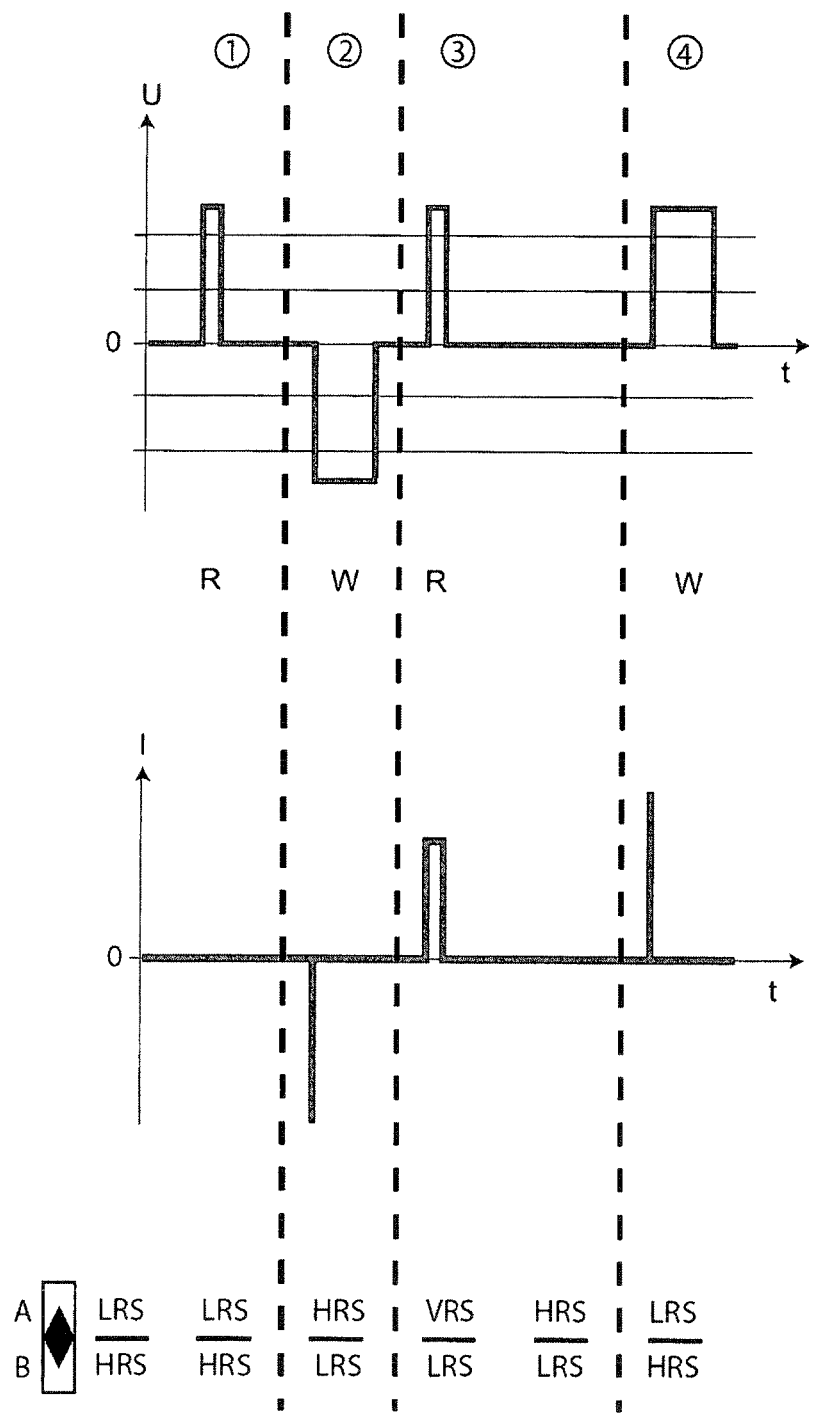
FIG. 1b illustrates the non-destructive read-out of a resistive memory element composed of two memory cells A and B using the method according to the invention.

In FIG. 1a, the read pulse R differs from the write pulse W having the same polarity by the lower level thereof but lasts equally as long as the write pulse W. In FIG, 1b, the read pulse R differs from the write pulse W having the same polarity by the shorter duration thereof, but is equally as high. In the top curve, the respective time profile of the voltage U that is applied to the memory element (U against the time t) is plotted; in the bottom curve, the time profile of the current I that is driven through the memory element (I against the time t) is plotted. The bottom of FIGS. 1a and 1b each show the states of the memory cells A and B, which are connected in series in the memory element. The memory element has a polarity such that positive read or write voltages are able to transfer the memory cell A from the HRS state to VRS or LRS.

In the beginning, the memory element is in the LRS/HRS state (0). A positive read pulse (step 1) does not change this state, so that the overall resistance of the memory element remains high, and no noteworthy current is driven through the memory element. A negative write pulse (step 2) switches the memory element into the HRS/LRS state (1). It thus remains in a high-resistance state, so that still no noteworthy current flows. If a positive read pulse is now applied again (step 3), the memory cell A is switched from HRS to VRS, and the overall resistance of the memory element decreases. An easily detectable read current flows. After the read pulse has ended, the memory cell A relaxes again back into the HRS state, so that the overall memory element is again in the state in which it was prior to the start of the read pulse. The time scale on which this relaxation takes place is illustrated in a drastically exaggerated form in FIG. 1. In step 4, the memory element is finally transferred permanently into the LRS/HRS state (0) by a positive write pulse.

The invention claimed is:

1. A method for reading out a resistive memory cell comprising two electrodes that are spaced from each other by an ion-conducting resistive material, the memory cells being transferrable from a stable state HRS having a higher resistance value into a stable state LRS having a lower resistance value when a write voltage is applied, in that the write voltage drives migration of ions through the ion-conducting resistive material, and an electrically conducting path through the ion-conducting resistive material is formed along the path of this migration, a read voltage having the same polarity as the write voltage being applied applied for read-out, and the current flowing through the memory cell being evaluated, wherein the read voltage is applied as a read pulse, wherein the number of ions driven driven through the ion-conducting resistive material during the pulse is set by way of of the level and duration of the pulse in such a way that, proceeding from the HRS state, they suffice for foaming an electrically conducting path through the ion-conducting resistive material, at least until the onset of a flow of current through through this path, and thus for the transition into a metastable VRS state having a reduced resistance value and a predefined relaxation time for return into the HRS state, but not for transition into the LRS state, and further wherein a relaxation time of 10 s or less is selected.

2. The method according to claim 1, wherein ions of the material of an electrode or oxygen ions of the ion-conducting resistive material are driven through the ion-conducting resistive material so as to form the path.

3. The method according to claim 1, wherein the read pulse is terminated.

4. The method according to claim 1, wherein the resistance value is measured using a further pulse after the relaxation time has expired, the level and duration of the pulse being selected such that it is not sufficient for either a transition from HRS to VRS or a transition from LRS to HRS.

5. The method according to claim 1, wherein a memory cell is selected that can be transferred from the stable state LRS to the stable state HRS by a second write voltage having reverse polarity.

6. The method according to claim 1, wherein a memory cell that is in series connection with a further memory cell is selected, and the read pulse is applied via the series connection.

7. The method according to claim 1, wherein the relaxation time is between $10^{-10}$ s and $10^{-5}$ s.

8. The method according to claim 7, wherein the relaxation time is between $10^{-9}$ s and $10^{-6}$ s.

9. A memory cell for carrying out the method according to claim 1, comprising two electrodes and a resistive memory material that that is connected between the electrodes, the material having a stable state LRS having a lower electrical resistance and a stable state HRS having a higher electrical electrical resistance, characterized in that the memory material can be transferred into a third metastable state having a resistance value no more than one tenth the resistance value of the HRS state, wherein proceeding from this VRS state, the memory material transitions into the HRS state after expiration of a predefined relaxation time.

10. The memory cell according to claim 9, wherein the memory material is an ion-conducting resistive material through which an electrically conducting path runs between the two electrodes in the LRS state.

11. The memory cell according to claim 9, wherein the resistance value of the VRS state is at least twice as high, preferably at least five times as high, and most particularly preferably at least ten times as high as the resistance value of the LRS state.

12. The memory cell according to claim 9, wherein the resistance value of the VRS state is between 10 kΩ and 15 kΩ.

13. The memory cell according to claim 9, wherein the resistance value of the LRS state is 5 kΩ or less and most 1kΩ or less.

14. The memory cell according to claim 9, wherein the memory material is an ion-conducting resistive material, which is electrochemically metallized by at least one electrode material during the switch from the HRS state into the LRS state.

15. The memory cell according to claim 14, wherein the memory material comprises a semiconductor, and at least one of the electrodes comprises a precious metal.

16. The memory cell according to claim 15, wherein germanium or silicon is the semiconductor.

17. The memory cell according to claim 15, wherein the memory material comprises a compound of the semiconductor with sulfur, selenium or tellurium.

18. The memory cell according to claim 15, wherein silver as the precious metal.

19. The memory cell according to claim 14, wherein the memory material comprises a compound of at least one metal that is also present in at least one electrode.

20. The memory cell according to claim 19, wherein the metal is copper or silver.

21. The memory cell according to claim 19, wherein the compound comprises sulfur, selenium or tellurium.

22. A method for reading out a resistive memory cell comprising two two electrodes that are spaced from each other by an ion-conducting resistive material, the memory cells being transferrable from a stable state HRS having a higher resistance value into a stable state LRS having a lower resistance value when a when a write voltage is applied, in that the write voltage drives migration of ions through the ion-conducting resistive material, and an electrically conducting path through the ion-conducting resistive material is formed along the path of this migration, a read voltage having the same polarity as the write voltage being applied applied for read-out, and the current flowing through the memory cell being evaluated, wherein the read voltage is applied as a read pulse, wherein the number of ions driven through the ion-conducting resistive material during the pulse is set by way of the level and duration of the pulse in such a way that, proceeding from the HRS state, they suffice for forming an electrically conducting path through the ion-conducting resistive material, at least until the onset of a flow of current through this path, and thus for the transition into a metastable VRS state having a reduced resistance value and a predefined relaxation time for return into the HRS state, but not for transition into the LRS state, and further wherein a VRS state having a resistance value that ranges between the resistance values of the HRS and LRS states is selected.

* * * * *